US012707611B2

(12) United States Patent
Liu et al.

(10) Patent No.: US 12,707,611 B2
(45) Date of Patent: Aug. 11, 2026

(54) ELECTROSTATIC DISCHARGE PROTECTION ARRANGEMENT FOR FREQUENCY CONVERTER

(71) Applicant: Zhejiang Holip Electronic Technology Co., Ltd., Haiyan (CN)

(72) Inventors: Yuedong Liu, Nordborg (DK); Tingzhong Peng, Nordborg (DK)

(73) Assignee: ZHEJIANG HOLIP ELECTRONIC TECHNOLOGY CO., LTD., Zhejiang (CN)

(*) Notice: Subject to any disclaimer, the term of this patent is extended or adjusted under 35 U.S.C. 154(b) by 151 days.

(21) Appl. No.: 18/453,076

(22) Filed: Aug. 21, 2023

(65) Prior Publication Data

US 2024/0074128 A1 Feb. 29, 2024

(30) Foreign Application Priority Data

Aug. 24, 2022 (CN) ........................ 202222236232.X

(51) Int. Cl.
*H05K 9/00* (2006.01)
*H05K 1/02* (2006.01)

(52) U.S. Cl.
CPC ......... *H05K 9/0067* (2013.01); *H05K 1/0215* (2013.01); *H05K 9/0079* (2013.01)

(58) Field of Classification Search
CPC .......... H05K 9/00; H05K 1/02; H05K 9/0067; H05K 1/0215; H05K 9/0079
USPC ................................................. 361/212, 220
See application file for complete search history.

(56) References Cited

U.S. PATENT DOCUMENTS

| | | | | |
|---|---|---|---|---|
| 5,538,129 A * | 7/1996 | Chester | .................. | A61C 19/02 206/813 |
| 5,671,123 A * | 9/1997 | Omori | .................... | H05K 1/026 361/753 |
| 2005/0031823 A1* | 2/2005 | Aisenbrey | .............. | B32B 27/18 428/40.1 |

(Continued)

FOREIGN PATENT DOCUMENTS

| | | |
|---|---|---|
| CN | 201113778 Y | 9/2008 |
| DE | 102017216866 A1 | 3/2019 |

OTHER PUBLICATIONS

"Thermal Transfer Polyester Label Material", 3M, Technical Data, Dec. 2007.

(Continued)

*Primary Examiner* — Danny Nguyen
(74) *Attorney, Agent, or Firm* — McCormick, Paulding & Huber PLLC

(57) ABSTRACT

An electrostatic discharge protection arrangement for a frequency converter, including: a housing covering a circuit board of the frequency converter, wherein the housing is provided with an opening; a conductive label attached to the housing, wherein the conductive label is adjacent to the opening and enabled to guide static electricity generated at the opening; and a grounding point, wherein the grounding point is adjacent to the conductive label such that the static electricity generated at the opening is guided to the grounding point by the conductive label. By using the electrostatic discharge protection arrangement, electro-static discharge (ESD) may be conducted from the opening of the housing to other grounding points, and an ESD immunity requirement may be satisfied.

19 Claims, 3 Drawing Sheets

(56) References Cited

U.S. PATENT DOCUMENTS

| | | | | |
|---|---|---|---|---|
| 2008/0261056 | A1 * | 10/2008 | Labrousse | C03C 8/12<br>106/286.6 |
| 2014/0226293 | A1 * | 8/2014 | Sato | G06K 19/07735<br>361/752 |
| 2019/0088583 | A1 * | 3/2019 | Ashikaga | H05K 3/284 |

OTHER PUBLICATIONS

3M Thermal Transfer Polyester Label Material 7818, 3M, May 2017, pp. 1-23.

* cited by examiner

ELECTROSTATIC DISCHARGE PROTECTION ARRANGEMENT FOR FREQUENCY CONVERTER

CROSS-REFERENCE TO RELATED APPLICATION

This application claims foreign priority benefits under 35 U.S.C. § 119 from Chinese Patent Application No. 202222236232.X, filed Aug. 24, 2022, the content of which is hereby incorporated by reference in its entirety.

TECHNICAL FIELD

The present disclosure relates to electrostatic discharge protection of a frequency converter, and in particular to an electrostatic discharge protection arrangement for a frequency converter using a conductive label.

BACKGROUND

A frequency converter is generally provided with a housing to protect an internal circuit of the frequency converter. Due to a manufacturing process, there must be an opening (e.g., a hole for demolding) in the housing. The opening will expose a component on an internal circuit board of the frequency converter.

An operator may touch the opening during a normal operation and cause electro-static discharge (ESD) at the opening. The electro-static discharge will damage the component on the circuit board close to the opening. There are usually three methods to provide effective electrostatic discharge protection. The first method is to increase a distance between the opening and the component on the circuit board (such as PCB board); the second method is to cover the opening with polyester film; and the third method is to use a metal part to guide the ESD to ground.

However, increasing the distance between the opening and the component of the circuit board will result in an increase in a size of the frequency converter. For some frequency converters, the size is a key parameter that affects the assembly and cost of the frequency converter, and in some cases, the size may not be increased. For the method of using polyester film to cover the opening, the polyester film should be pasted on an inner side of the housing of the frequency converter. However, for a small-sized frequency converter, it is impossible to artificially paste the polyester film on the inner side of the housing of the frequency converter. In addition, if a metal part is used to guide the ESD to ground, then how to fix the metal part is a problem, and use of the metal part and the resulting fixation, installation, mold opening, etc. will lead to increased costs and/or technical issues.

Therefore, there is a need for an electrostatic discharge protection arrangement with simple assembly and low cost to provide effective ESD protection at the opening.

SUMMARY

The present disclosure provides an electrostatic discharge protection arrangement for a frequency converter, which may simply and easily meet the ESD immunity requirement without affecting the size of the frequency converter.

An aspect of the present disclosure provides an electrostatic discharge protection arrangement for a frequency converter. The electrostatic discharge protection arrangement includes: a housing covering a circuit board of the frequency converter, wherein the housing is provided with an opening; a conductive label attached to the housing, wherein the conductive label is adjacent to the opening and enabled to guide static electricity generated at the opening; and a grounding point, wherein the grounding point is adjacent to the conductive label such that the static electricity generated at the opening is guided to the grounding point by the conductive label.

According to embodiments of the present disclosure, a resistance value between two farthest points on the conductive label is less than 100 ohms.

According to embodiments of the present disclosure, a distance between the conductive label and the opening in a width direction of the opening is zero.

According to embodiments of the present disclosure, a sum of a distance between the grounding point and the conductive label and a width of the opening is less than half of a distance from the opening to the circuit board.

According to embodiments of the present disclosure, the grounding point is a shielding case of a terminal RJ 45 of the frequency converter.

According to embodiments of the present disclosure, a distance between the conductive label and the grounding point is less than or equal to 1.0 mm.

According to embodiments of the present disclosure, information related to the frequency converter is displayed on the conductive label, and an adhesive coating is provided on a backside of the conductive label.

According to embodiments of the present disclosure, the conductive label is a label made of 3M 7818 series label material.

According to the electrostatic discharge protection arrangement of embodiments of the present disclosure, ESD at the opening is guided by the conductive label to other points, such as a grounding point, so as not to cause damage to the component(s) on the circuit board near the opening.

Compared with the traditional electrostatic discharge protection methods, the electrostatic discharge protection arrangement according to embodiments of the present disclosure has higher performance and less cost, and is easier to assemble while meeting the requirement of ESD immunity.

BRIEF DESCRIPTION OF THE DRAWINGS

The above and other aspects, features, and advantages of embodiments of the present disclosure will be more apparent based on the following description in conjunction with the accompanying drawings.

DETAILED DESCRIPTION

Embodiments of the present disclosure will be described below with reference to the accompanying drawings. However, it should be understood that these descriptions are merely exemplary and are not intended to limit the scope of the present disclosure. In addition, in the following descriptions, descriptions of well-known structures and technologies are omitted to avoid unnecessarily obscuring the concept of the present disclosure.

Terms used herein are for the purpose of describing embodiments only and are not intended to limit the present disclosure. The words "one", "a (an)" and "the" used herein should also include the meanings of "more" and "a plurality of", unless the context clearly indicates otherwise. In addition, terms "comprising", "including" and the like used herein specify a presence of the feature, step, operation and/or component, but do not preclude a presence or addition of one or more other features, steps, operations or components.

All terms (including technical and scientific terms) used herein have the meaning as commonly understood by those skilled in the art, unless otherwise defined. It should be noted that the terms used herein should be construed to have meanings consistent with the context of the present description and should not be construed in an idealized or overly rigid manner.

As described earlier, there is an opening on the plastic housing of the frequency converter due to the manufacturing process, which easily causes an ESD problem. It is necessary to provide effective electrostatic discharge protection at the opening of the frequency converter.

The ESD requirements of some standards are that air discharges within a range of ±15 kV are considered acceptable. In order to meet the requirement, a spacing distance of at least 15 mm is required from an edge of the opening to any electronic components near the opening.

Since a circuit board layout may not achieve such a large blank region, and the size of the frequency converter may not be adjusted due to issues such as cost and use environment, the conventional method of achieving ESD protection by increasing distance is no longer applicable.

The electrostatic discharge protection arrangement proposed by the present utility model may perfectly solve the problem.

Figure 1:
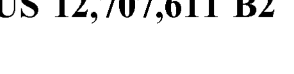
FIG. 1 shows an electrostatic discharge protection arrangement according to an embodiment.
Figure 1:
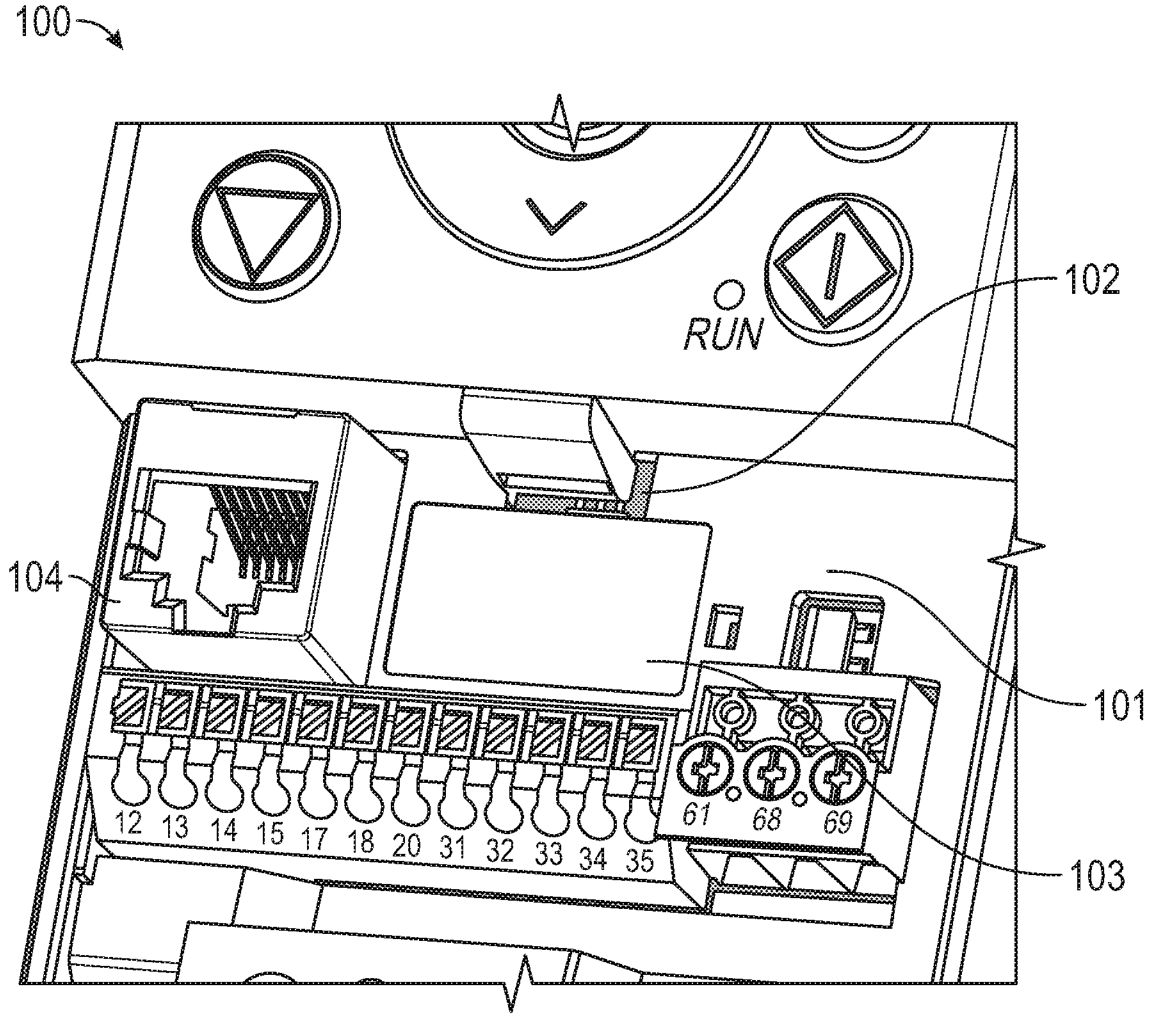

FIG. 1 shows an electrostatic discharge protection arrangement for a frequency converter according to an embodiment. As shown in FIG. 1, an electrostatic discharge protection arrangement 100 according to embodiments of the present disclosure includes a housing 101, an opening 102, a conductive label 103, and a grounding point 104. The housing 101 covers a circuit board of the frequency converter and is provided with the opening 102 due to manufacturing process and other reasons. A shape of the opening 102 varies depending on an actual process and other conditions. In this example, the opening 102 is rectangular. The conductive label 103 may be attached to the housing 101 by, for example, adhesive. A specific shape of conductive label 103 is not limited, and is shown as a rectangle in this example. The conductive label 103 is adjacent to the opening 102 and may conduct electricity, thereby guiding the static electricity generated at the opening 102 to a desired position. The grounding point 104 is adjacent to the conductive label 103 such that the static electricity generated at the opening 102 may be guided to the grounding point 104 through the conductive label 103.

According to an embodiment of the present disclosure, a resistance value between the two farthest points on the conductive label 103 is less than 100 ohms. In this way, the static electricity generated at the opening 102 may be conducted to the grounding point 104, without causing the static electricity to discharge at the opening 102 and damage the component on the circuit board below the opening 102.

Figure 2:
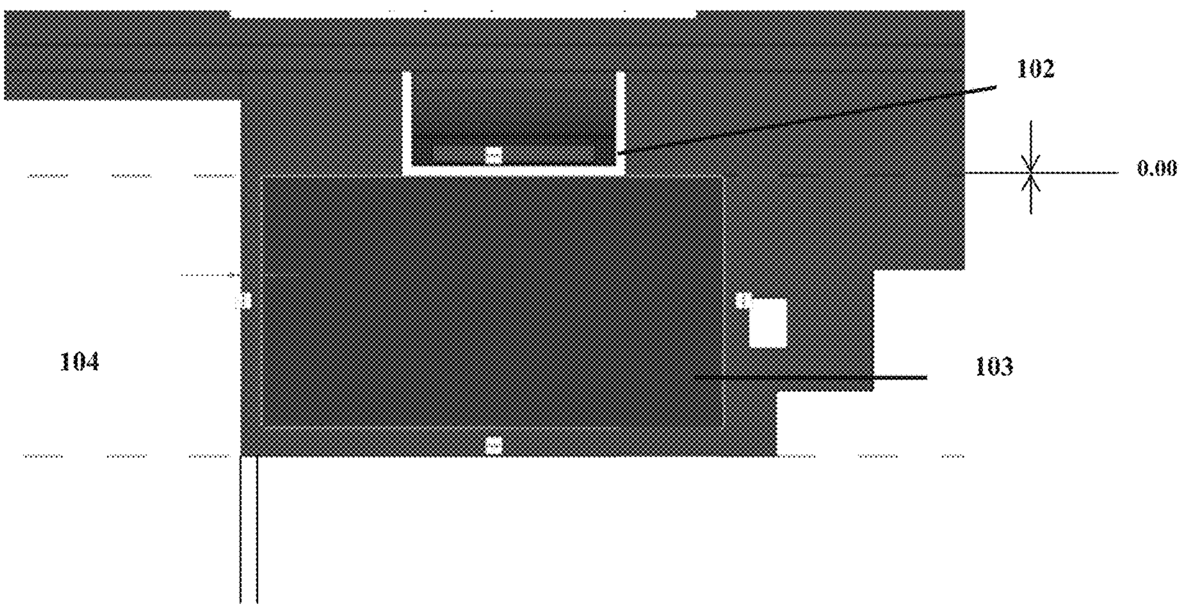
FIG. 2 is a schematic plan view of the electrostatic discharge protection arrangement of FIG. 1 according to an embodiment.

According to the embodiment of the present disclosure, both the opening 102 and the conductive label 103 are rectangular, and a distance between the conductive label 103 and the opening 102 in a width direction of the opening 102 should be as small as possible, preferably zero, that is, a long side of the rectangular conductive label 103 coincides with a long side of the rectangular opening 102 (as shown in FIG. 2).

The distance between the conductive label and the opening and the distance between the conductive label and the grounding point are crucial for the realization of ESD protection.

In order to prevent static electricity generated at the opening from discharging at the components on the circuit board and damaging the component, it is necessary to guide the static electricity to the grounding point. Therefore, the sum (i.e., a+b+c) of the width (e.g., set to a) of the opening, the distance (e.g., set to b) between the conductive label and the opening, and the distance (e.g. set to c) between the conductive label and the grounding point should be as small as possible compared to the distance (e.g., set to h) from the opening to the circuit board. According to an embodiment of the present disclosure, the distance between the conductive label and the opening may be zero (i.e., b=0). In this case, the sum of the distance between the grounding point 104 and the conductive label 103 and the width of the opening 102 is preferably less than half of the distance between the opening 102 and the circuit board, i.e., $a+c<h/2$. Experiments have shown that satisfying such conditions may achieve good ESD protection.

According to an embodiment of the present disclosure, the grounding point 104 may be an inherent grounding metal part of the frequency converter itself, for example, a shielding case/protective case of a certain terminal of the frequency converter. In this way, it does not need to additionally arrange the grounding point 104, rather it utilizes the existing resources, and the cost is saved. In this example, referring to FIG. 1 and FIG. 3, the grounding point 104 is shown as a shielding case of the terminal RJ45 of the frequency converter closer to the opening 102.

According to an embodiment of the present disclosure, the distance between the conductive label 103 and the grounding point 104 should be as small as possible, preferably less than or equal to 1.0 mm.

FIG. 2 is a schematic plan view of the electrostatic discharge protection arrangement of FIG. 1 according to an embodiment. In order to effectively achieve ESD protection, the position of the conductive label is crucial.

The distance between the conductive label and the opening should be as small as possible, so that in the event of electrostatic discharge occurring at the opening, the static electricity is guided to the grounding point through the conductive label without discharging to the component of the circuit board adjacent to the opening. As shown in FIG. 2, the distance between the conductive label 103 and the opening 102 (specifically, the distance between the conductive label 103 and the long side of the opening 102) is 0. In this way, it is ensured that the ESD is guided from the opening to the conductive label.

The distance between the conductive label and the grounding point (shown as the shielding case of the RJ45 in the embodiment) should also be as small as possible, so that in the event of electrostatic discharge occurring at the opening, the static electricity is guided to the grounding point through the conductive label without discharging to the component on the circuit board adjacent to the opening.

According to an embodiment of the present disclosure, as shown in FIG. 2, the short side of the rectangular conductive label 103 may be as close as possible to the shielding case of the RJ45. At the same time, considering the convenience of pasting, the distance between the short side of the conductive label 103 and the shielding case of the RJ45 is 1.0 mm.

Figure 3:
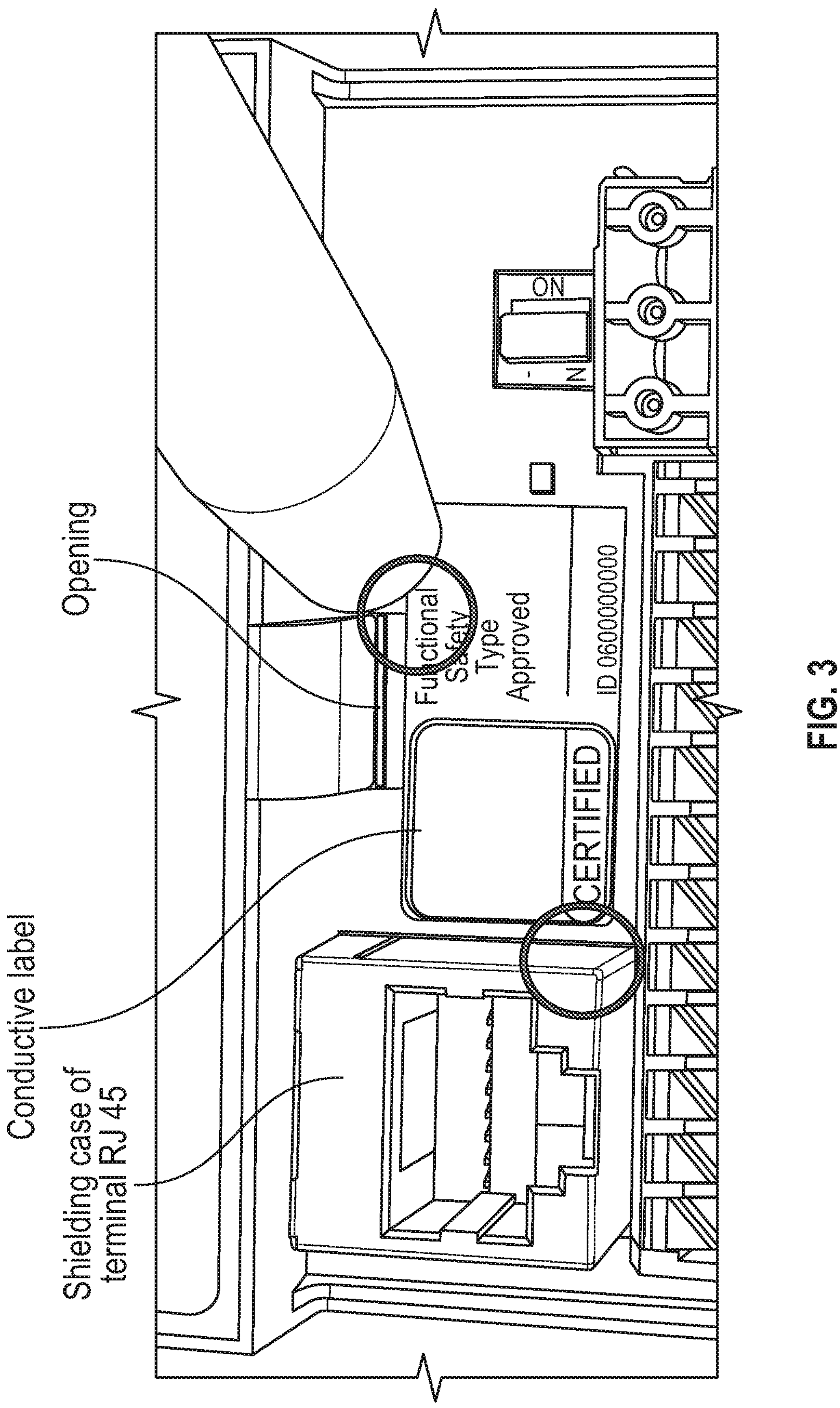
FIG. 3 is a schematic diagram showing two discharge positions in an ESD immunity test according to an embodiment.

FIG. 3 is a schematic diagram showing two discharge positions in an ESD immunity test according to an embodiment. An ESD immunity test is performed on the frequency converter at the opening. When ESD occurs around the opening, due to the properties of the conductive label, the ESD will be guided to the conductive label and then discharged to the shielding case of the terminal RJ45. FIG. 3 shows that two discharges occur, as indicated by the circles in FIG. 3. As shown in FIG. 3, the solution of the present disclosure ensures that the static electricity does not discharge towards the component on the circuit board below the opening, but is guided to the shielding case of the terminal RJ45, i.e. the grounding point, through the conductive label.

According to an embodiment of the present disclosure, information related to the frequency converter is also displayed on the conductive label, such as product certification information, manufacturer, brand, delivery date, and the like. In other words, the solution utilizes a conductive property of the label which is used to display information related to the frequency converter for ESD protection.

According to an embodiment of the present disclosure, the conductive label may not be pure metal, and the selection of its material only needs to meet the requirement of guiding the static electricity from the opening to the grounding point when the static electricity is generated at the opening. For example, the conductive label may be 3M™ 7818 series label or a label made of other materials with similar conductive properties.

The conductive label is easy to stick and install. An adhesive coating is provided on a backside of the conductive label. A location is reserved for the conductive label during the initial design of the housing so that the conductive label is adjacent to the opening. When assembling, the conductive label may be directly attached to the reserved location through its adhesive. The adhesive may be, for example, 3M™ adhesive 310, which is a sturdy adhesive. This kind of adhesive can prevent seepage and provide high strength on various surfaces including plastics with high surface energy (HSE) and metals.

Those skilled in the art will appreciate that features recited in the various embodiments of the present disclosure and/or the claims may be combined and/or incorporated in a variety of ways, even if such combinations or incorporations are not clearly recited in the present disclosure. In particular, the features recited in the various embodiments of the present disclosure and/or the claims may be combined and/or incorporated without departing from the spirit and teachings of the present disclosure, and all such combinations and/or incorporations fall within the scope of the present disclosure.

The present disclosure has been illustrated and described with reference to specific exemplary embodiments of the present disclosure. However, those skilled in the art should understand that without departing from the spirit and scope of the present disclosure defined by the appended claims and their equivalents, various changes in forms and details may be made to the present disclosure. Therefore, the scope of the present disclosure should not be limited to the aforementioned embodiments, but should be determined not only by the appended claims, but also by the equivalents of the appended claims.

What is claimed is:

1. An electrostatic discharge protection arrangement for a frequency converter, comprising:

a housing covering a circuit board of the frequency converter, wherein the housing is provided with an opening;

a conductive label attached to the housing, wherein the conductive label is adjacent to the opening and enabled to guide static electricity generated at the opening; and a grounding point, wherein the grounding point is adjacent to the conductive label such that the static electricity generated at the opening is guided to the grounding point by the conductive label, wherein a distance between the conductive label and the opening in a width direction of the opening is zero, and wherein a sum of a distance between the grounding point and the conductive label and a width of the opening is less than half of a distance from the opening to the circuit board.

2. The electrostatic discharge protection arrangement according to claim 1, wherein a resistance value between the two farthest points on the conductive label is less than 100 ohms.

3. The electrostatic discharge protection arrangement according to claim 1, wherein the grounding point is a shielding case of a terminal RJ 45 of the frequency converter.

4. The electrostatic discharge protection arrangement according to claim 1, wherein a distance between the conductive label and the grounding point is less than or equal to 1.0 mm.

5. The electrostatic discharge protection arrangement according to claim 1, wherein information related to the frequency converter is displayed on the conductive label, and an adhesive coating is provided on a backside of the conductive label.

6. The electrostatic discharge protection arrangement according to claim 1, wherein the conductive label is a label made of 3M 7818 series label material.

7. An electrostatic discharge protection arrangement for a frequency converter, comprising:

a housing covering a circuit board of the frequency converter, wherein the housing is provided with an opening;

a conductive label attached to the housing, wherein the conductive label is adjacent to the opening and enabled to guide static electricity generated at the opening; and a grounding point, wherein the grounding point is adjacent to the conductive label such that the static electricity generated at the opening is guided to the grounding point by the conductive label, wherein the grounding point is a shielding case of a terminal RJ 45 of the frequency converter.

8. The electrostatic discharge protection arrangement according to claim 1, wherein a resistance value between the two farthest points on the conductive label is less than 100 ohms.

9. The electrostatic discharge protection arrangement according to claim 1, wherein a distance between the conductive label and the opening in a width direction of the opening is zero.

10. The electrostatic discharge protection arrangement according to claim 9, wherein a sum of a distance between the grounding point and the conductive label and a width of the opening is less than half of a distance from the opening to the circuit board.

11. The electrostatic discharge protection arrangement according to claim 1, wherein a distance between the conductive label and the grounding point is less than or equal to 1.0 mm.

12. The electrostatic discharge protection arrangement according to claim 1, wherein information related to the frequency converter is displayed on the conductive label, and an adhesive coating is provided on a backside of the conductive label.

13. The electrostatic discharge protection arrangement according to claim 1, wherein the conductive label is a label made of 3M 7818 series label material.

14. The electrostatic discharge protection arrangement according to claim 1, wherein a resistance value between the two farthest points on the conductive label is less than 100 ohms.

15. The electrostatic discharge protection arrangement according to claim 1, wherein a distance between the conductive label and the opening in a width direction of the opening is zero.

16. The electrostatic discharge protection arrangement according to claim 15, wherein a sum of a distance between the grounding point and the conductive label and a width of the opening is less than half of a distance from the opening to the circuit board.

17. The electrostatic discharge protection arrangement according to claim 1, wherein the grounding point is a shielding case of a terminal RJ 45 of the frequency converter.

18. The electrostatic discharge protection arrangement according to claim 1, wherein a distance between the conductive label and the grounding point is less than or equal to 1.0 mm.

19. The electrostatic discharge protection arrangement according to claim 1, wherein the conductive label is a label made of 3M 7818 series label material.

* * * * *